US007241124B2

(12) United States Patent
Roberts et al.

(10) Patent No.: US 7,241,124 B2
(45) **Date of Patent: *Jul. 10, 2007**

(54) APPARATUS FOR THE RAPID DEVELOPMENT OF PHOTOSENSITIVE PRINTING ELEMENTS

(75) Inventors: David Roberts, Carlsbed, CA (US); Donald Cerney, Escondido, CA (US)

(73) Assignee: Napp Systems, Inc., San Marcos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/588,951

(22) Filed: Oct. 27, 2006

(65) Prior Publication Data

US 2007/0041741 A1 Feb. 22, 2007

Related U.S. Application Data

(63) Continuation of application No. 10/970,881, filed on Oct. 22, 2004, now Pat. No. 7,156,630.

(51) Int. Cl.
*B29C 71/00* (2006.01)
*G03F 7/34* (2006.01)

(52) U.S. Cl. ..................... 425/73; 425/174.4; 425/210; 425/445; 101/401.1; 430/306; 430/309

(58) Field of Classification Search .................. 425/73, 425/74, 174.4, 210, 445; 101/401.1; 430/306, 430/309
See application file for complete search history.

(56) References Cited

U.S. PATENT DOCUMENTS

| | | | |
|---|---|---|---|
| 5,175,072 | A | 12/1992 | Martens |
| 5,279,697 | A | 1/1994 | Peterson et al. |
| 6,171,758 | B1 | 1/2001 | Bhateja et al. |
| 6,551,759 | B2 | 4/2003 | Daems et al. |
| 6,797,454 | B1 | 9/2004 | Johnson et al. |
| 6,998,218 | B2 | 2/2006 | Markhart |
| 7,044,055 | B2 | 5/2006 | Gotsick et al. |
| 2004/0048199 | A1 | 3/2004 | Schadebrodt et al. |

FOREIGN PATENT DOCUMENTS

EP 0 665 471 A2 2/1995

*Primary Examiner*—James P. Mackey
(74) *Attorney, Agent, or Firm*—Carmody & Torrance LLP

(57) ABSTRACT

This invention pertains to a system for thermally treating a photosensitive element to form a relief structure suitable for flexographic printing. The system of the invention comprises a plurality of consecutively arranged blotting stations for removing uncured photopolymer from the imaged surface of the photosensitive printing element. The flexographic plates produced in the apparatus of the invention are especially suited for use in printing newspapers and other publications.

23 Claims, 2 Drawing Sheets

APPARATUS FOR THE RAPID DEVELOPMENT OF PHOTOSENSITIVE PRINTING ELEMENTS

This is a continuation of application Ser. No. 10/970,881, filed Oct. 22, 2004 now U.S. Pat. No. 7,156,630.

FIELD OF THE INVENTION

This invention pertains to an apparatus for thermally treating a photosensitive element to form a relief structure suitable for flexographic printing. The flexographic plates produced in the apparatus of the invention are especially suited for use in printing newspapers and other publications.

BACKGROUND

Flexography is a method of printing that is commonly used for high-volume runs. Flexography is employed for printing on a variety of substrates such as paper, paperboard stock, corrugated board, films, foils and laminates. Newspapers and grocery bags are prominent examples. Flexographic printing plates are relief plates with image elements raised above open areas. Such plates offer a number of advantages to the printer, based chiefly on their durability and the ease with which they can be made.

Essentially all flexographic newspaper producers today use high-pressure water spray to process their printing plates. Examples of these systems are described in U.S. Pat. No. 4,196,018 to Inoko et al. and in U.S. Pat. No. 4,801,815 to Horner. While this approach is fast, it has a number of deficiencies. First, this approach requires plumbing to transport the water to the process and energy to heat the water used in the process. Also, the process generates aqueous effluent, which must then be disposed. Often, treatment is needed before the effluent is disposed of, adding to the expense. Finally, the special polymer chemistry needed to obtain water dispersibility may limit the durability and resolution of the photopolymer resin of the printing plate. Thus, it is highly desirable in the flexographic prepress printing industry to eliminate the need for chemical processing of printing elements in developing relief images, in order to go from plate to press more quickly and to avoid the deficiencies of the solvent-based processes of the prior art.

Thermal blotting is a process that has been gaining popularity for the production of flexographic plates. It is a user-friendly process that produces a high quality plate. However, in its current implementation, it is very slow—too slow for processing newspapers and other publications. In the thermal blotting process, photopolymer printing plates are prepared using heat and the differential melting temperature between cured and uncured photopolymer is used to develop the latent image. The basic parameters of this process are known, as described in U.S. Pat. No. 5,279,697 to Peterson et al., U.S. Pat. No. 5,175,072 to Martens, U.S. patent publication No. U.S. 2003/0180655 to Fan et al., and in U.S. patent publication No. 2003/0211423 to Mengel et al. These processes allow for the elimination of development solvents and the lengthy plate drying times needed to remove the solvent. However, additional modifications are needed to the speed and efficiency of the process to allow for its use of the process in the manufacture of flexographic plates for printing newspapers and other publications where quick turnaround times and high productivity are important.

The thermal plate processors currently in use for packaging flexographic plates are not appropriate for flexographic newspaper plates. The main problem is that they are too slow, by at least about an order of magnitude because only one blotting station is used. In the current process, the flexographic plate is affixed to a drum or belt and passed multiple times through the blotter station until the uncured resin is removed. Preferably, the radiation curable layer is contacted with a preheated web of absorbent material. The heat in the absorbent web is transferred to the radiation curable layer upon contact, and the temperature of the radiation curable layer is raised to a temperature sufficient to enable the uncured portions of the radiation curable layer to soften or liquefy and be absorbed into the absorbent web. While still in the heated condition, the absorbent sheet material is separated from the cured radiation curable layer in contact with the support layer to reveal the relief structure. The printing plate is then manually removed from the apparatus and placed into a separate machine for post curing.

U.S. Pat. No. 5,279,697 to Peterson et al. depicts a typical thermal development device using a hot roller and an absorbent material that is contacted with the heated printing plate. This device requires that the printing element be passed multiple times through the hot rollers to remove all of the molten polymer from the surface of the printing element. U.S. Pat. No. 6,551,759 to Daems et al. suggests the use of a laminator for thermal development, whereby the printing plate is contacted with a cleaning cloth and passed through lamination rollers. Again, multiple passes of the printing plate through the device are required to remove all of the uncured photopolymer.

The present invention provides a novel system for the rapid thermal development of flexographic newspaper plates that overcomes many of the disadvantages of the prior art.

The present invention is directed to a novel system for thermally developing flexographic printing plates comprising a plurality of consecutively arranged blotting stations, each of said blotting stations comprising a pair of rolls forming a nip gap between which the imaged and exposed flexographic printing plate is passed along with means for heating at least one of the rolls in each of the plurality of blotting stations and means for conveying the flexographic printing plate through each of the plurality of consecutively arranged blotting stations. Unlike thermal development systems of the prior art, the system of the present invention achieves complete removal of resin from the printing element in only one pass.

The thermal development system of the present invention also provides numerous advantages over high pressure water spray developing systems of the prior art.

The novel system of the invention does not use water. Thus, no water hook-ups are required and there is no aqueous waste that needs to be treated and disposed. The lack of solvent (i.e., water) also means that no drying step is required, shortening the plate making process. Finally, with no requirement for water dispersibility, the chemical formulation of the printing plates is greatly expanded. A wider range of monomers, polymers, and additive can be used to achieve the desired performance characteristics of the flexographic printing plate, resulting in higher performance (e.g., on-press lifetime and resolution) and a lower resin cost.

The system of the instant invention is very fast and is set up as a single-pass design, intended for high volume users. Productivities of greater than 150 $ft^2$/hour are possible, and single plates can be ready in as little as five minutes. Each blotting station of the present invention can be individually optimized for temperature, nip gap, and compliant roll durometer/thickness, enabling greater flexibility in processing. Finally, post-curing is built into the process. After bending and punching, if needed, the printing plate is ready for press.

SUMMARY OF THE INVENTION

It is an object of the present invention to provide a thermal developing system that can rapidly process photosensitive printing elements in a single-pass design.

It is another object of the present invention to provide a thermal developing system that can be used in the manufacture of photosensitive flexographic printing plates for printing newspapers and other publications.

Finally, it is an object of the present invention to provide a thermal developing system with multiple blotting stations, wherein each individual blotting station can be independently optimized for temperature, nip gap width, and compliant roll durometer/thickness to enable greater flexibility in photosensitive printing plate processing.

To that end, the present invention is directed to a system for thermally developing a photosensitive printing element to remove non-crosslinked photopolymer from an imaged surface of the photosensitive printing element, wherein the non-crosslinked photopolymer on the imaged surface of the photosensitive printing element is capable of being partially softened upon exposure to heat, the system comprising:

a plurality of consecutively arranged blotting stations, each of said plurality of consecutively arranged blotting stations comprising a first roll and a second roll, the first roll and the second roll forming a gap between which the photosensitive printing element is transported;

means for heating at least the first roll in each of the plurality of consecutively arranged blotting stations;

means for transporting the photosensitive printing element through the plurality of consecutively arranged blotting stations; and means for providing blotting material to at least a portion of the first roll of each of the plurality of consecutively arranged blotting stations that is contactable with the photosensitive printing element;

wherein when the photosensitive printing element passes through the nip gap of each of the plurality of consecutively arranged blotting stations and contacts the blotting material arranged around at least the portion of the heated first roll, non-crosslinked photopolymer on the imaged surface of the photosensitive printing element is softened and removed by the blotting material.

BRIEF DESCRIPTION OF THE DRAWINGS

For a fuller understanding of the invention, reference is had to the following description taken in connection with the accompanying figures, in which.

Also, while not all elements are labeled in each figure, all elements with the same reference number indicate similar or identical parts.

DETAILED DESCRIPTION OF THE PREFERRED EMBODIMENTS

Figure 1:
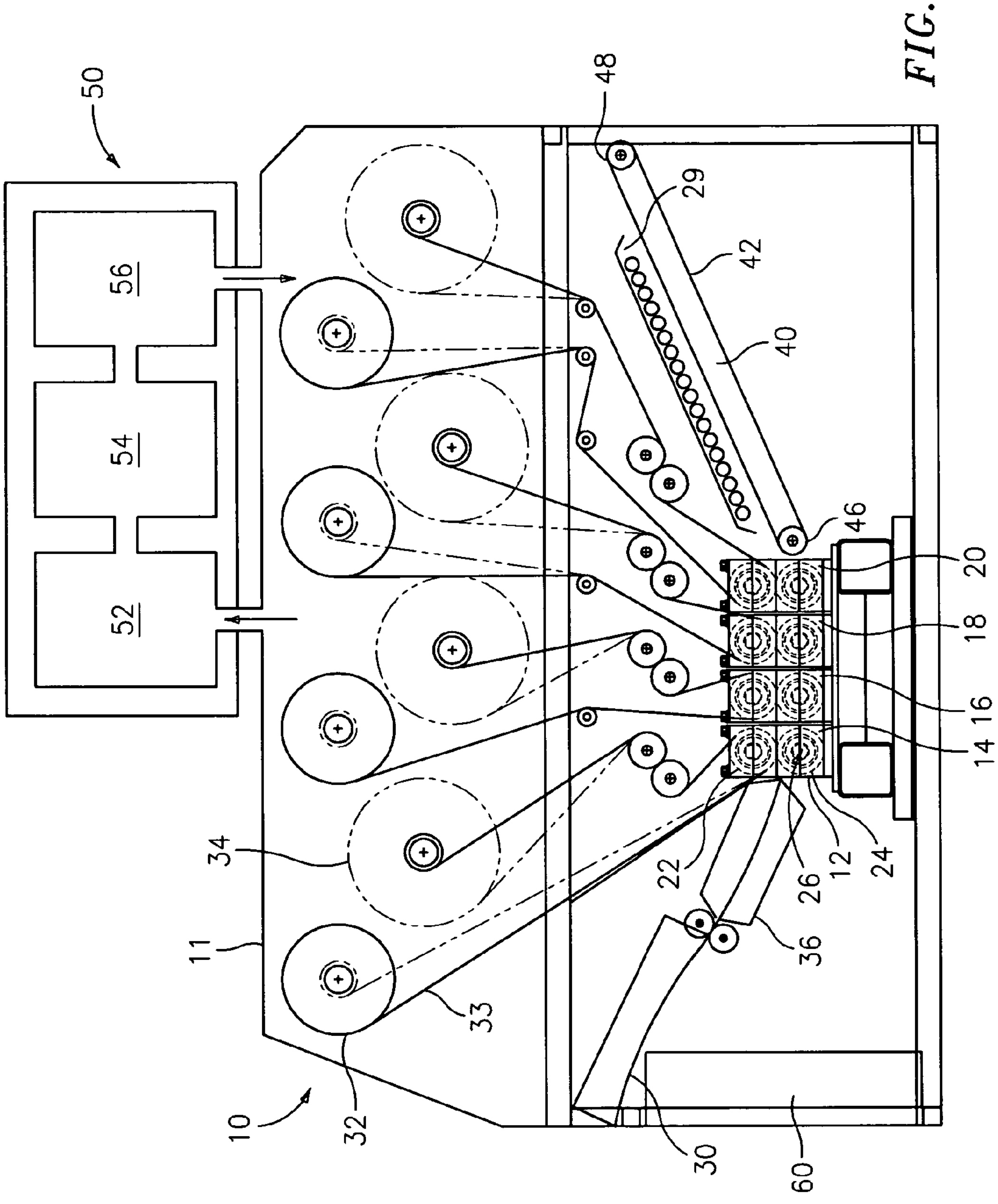
FIG. 1 is a cross sectional view of the thermal developing system of the invention.
Figure 2:
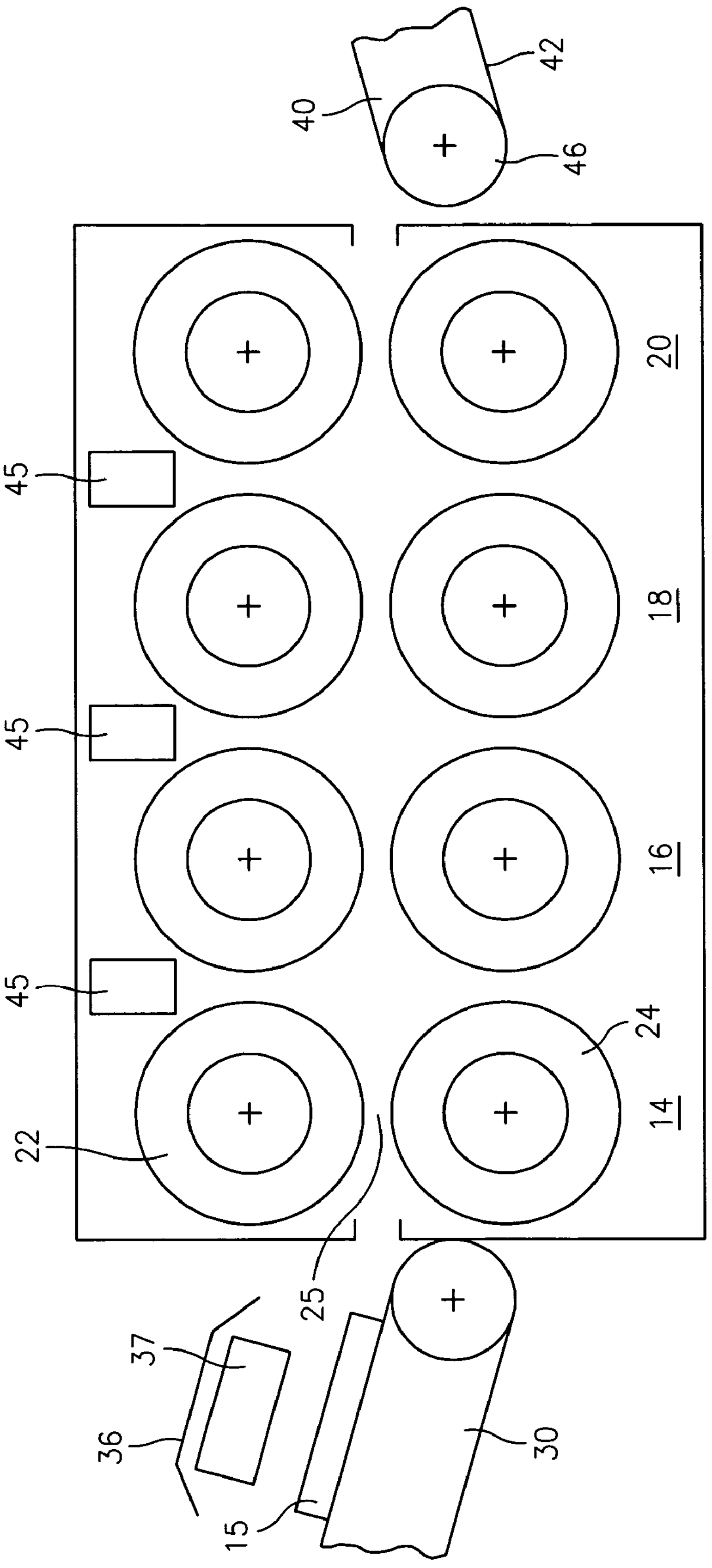
FIG. 2 is a different view of the thermal developing system of the invention.

The present invention is directed to an improved thermal developing system that allows for rapid plate processing. The design of the invention comprises two or more consecutively arranged blotting stations, wherein the number of consecutively arranged blotting stations required depends primarily on the amount of plate relief to be removed.

The consecutive disposition of multiple blotting stations provides for a high-speed operation. Single plates are processed rapidly and a high throughput is realized in a continuous operation basis. The path taken by the flexo plate during processing is "straight-through", which lends itself well to the workflow layout desired by most newspapers. The exiting plate can be fed directly into a punch/bend machine or other device. A "puncher" can be used to provide holes in the longitudinal direction end portions of the printing plate to aid in positioning the printing plate on the plate cylinder of the rotary printing press. A plate bender can optionally be used to ready the plate for mounting on the press cylinder. Examples of punch/bend machines as used in manufacture of newspaper printing machines are described in U.S. Pat. No. 6,247,404 to Okamura and in U.S. Pat. No. 5,257,444 to Nishiyama.

The speed and efficiency of the system of the invention allows for its use in the manufacture of flexographic plates for printing newspapers and other publications where quick turnaround times and high productivity are important. In fact, it is believed that standard sized newspaper printing plates can be processed in less than 5 minutes. The plates produced are of high quality and the overall cost of production of the printing plates is more favorable than that of the older organic solvent or aqueous development processes.

As depicted in the figures, the present invention is directed to a system 10 for thermally developing flexographic printing plates to form a relief image. The photosensitive printing element is thermally developed to remove non-crosslinked photopolymer from an imaged surface of the photosensitive printing element.

The thermal processing system of the invention comprises a plurality of consecutively arranged blotting stations 14, 16, 18, and 20 for removing unexposed resin from a surface of an imaged and exposed photosensitive printing element. Prior to being processed in the thermal developing system of the invention, the photosensitive printing element is imaged and exposed as is known in the art. A negative film mask is used to imagewise expose the plate and thereby cure the desired portions of the photopolymer resin. Prior to imagewise exposure, an optional blanket pre-exposure can be applied to the photopolymer and thereby enhance the speed of the imagewise exposure step. After imagewise exposure, the resultant radiation curable layer consists of cured portions and uncured portions. The photosensitive printing element is then ready for processing through the thermal developing system of the invention.

The photosensitive printing element generally has at least one layer that is capable of being partially softened upon exposure to heat. The photosensitive printing plate typically comprises at least two layers, a substrate layer and at least one photopolymer layer. Optionally, an infrared sensitive layer may be placed on top of the radiation curable layer and is used to form an in situ mask on the curable layer using infrared laser radiation prior to exposure to actinic radiation. In one embodiment of the invention, the photosensitive printing element comprises a heat-resistant substrate selected from the group consisting of steel, aluminum, and high temperature polymers. In a preferred embodiment, the substrate layer is comprised of metal. The metallic substrate provides a base structure for the photopolymer layer, allows for heated development at higher temperatures and allows for effective mounting on the printing press.

The photopolymer layer allows for the creation of the desired image and provides a printing surface. The photopolymers used generally comprise one or more of the following materials; binders; monomers, photoinitiators and other performance additives. Various photopolymers such as those based on polystyrene—isoprene—styrene, polystyrene-butadiene—styrene, polyurethanes and/or thiolenes as binders are useful. Preferable binders are polystyrene—isoprene—styrene, and polystyrene—butadiene—styrene, especially block co-polymers of the foregoing. The composition of the photopolymer should be such that there exists a substantial difference in the melt temperature between the cured and uncured polymer, to allow the creation of an image in the photopolymer when heated. The uncured photopolymer (i.e., the portions of the photopolymer not contacted with actinic radiation) will melt or substantially soften while the cured photopolymer will remain solid and intact at the temperature chosen. The difference in melt temperature allows the uncured photopolymer to be selectively removed in the thermal developing system of the invention, thereby creating a relief image.

The exact temperature to which the printing element is heated depends upon the properties of the particular photopolymer being used. The development temperature is preferably set between the melt temperature of the uncured photopolymer on the low end and the melt temperature of the cured photopolymer on the upper end. This allows selective removal of the photopolymer, thereby creating the image. However, the development temperature should also not be so high as to exceed the melt temperature of the cured photopolymer or so high that it will degrade the cured photopolymer. The temperature should also be sufficient to melt or substantially soften the uncured photopolymer thereby allowing it to be removed.

The system of the invention generally comprises a plurality of consecutively arranged blotting stations 14, 16, 18, and 20. Each of the plurality of consecutively arranged blotting stations 14, 16, 18, and 20 comprises a first roll 22 and a second roll 24; the first roll 22 and the second roll 24 forming a gap 25 between which the photosensitive printing element 15 may be transported. Next, the system of the invention comprises means for heating at least one of the first roll 22 or the second roll 24 in each of the plurality of consecutively arranged blotting stations 14, 16, 18, and 20. The system of the invention also comprises means for transporting the photosensitive printing element 15 through the plurality of consecutively arranged blotting stations 14, 16, 18, and 20, and means for providing blotting material 33 to the first roll 22 of each of the plurality of consecutively arranged blotting stations 14, 16, 18, and 20. When the photosensitive printing element passes through the nip gap of each of the plurality of consecutively arranged blotting stations and contacts the blotting material arranged around at least the portion of the heated first roll, non-crosslinked photopolymer on the imaged surface of the photosensitive printing element is softened and removed by the blotting material.

The system of the invention preferably comprises at least two and as many as six blotting stations. The number of blotting stations required depends primarily on the amount of plate relief to be removed. Flexo newspapers today typically have a relief ranging from about 13.5 to about 15 mils. To achieve this relief thickness, approximately four blotting stations are needed. The plurality of consecutively arranged blotting stations 14, 16, 18, and 20 are preferably arranged in a substantially straight path.

In one embodiment of the invention, at least one of the first roll 22 and the second roll 24 of each of the plurality of consecutively arranged blotting stations 14, 16, 18, and 20 is covered with a compliant cover to improve resin cleanout. Compliant covers of various thicknesses and durometers may be used to achieve the desired relief on the printing elements being processed. Compliant covers with good thermal conductivity are preferred.

The means for heating at least one of the first roll 22 or the second roll 24 in each of the plurality of consecutively arranged blotting stations 14, 16, 18, and 20 typically comprises a core heater that is capable of maintaining a skin temperature on the first roll 22 or the second roll 24 that will soften or liquefy at least a portion of the photosensitive material. Although the heat source preferably comprises an electrical core heater, the use of steam, recirculating hot oil, hot air, and a variety of other heating sources may also provide the desired skin temperature. The temperature to which the first roll 22 and/or the second roll 24 is heated is chosen based on the composition of the photosensitive material and is based on the melting temperature of the monomers and polymers contained within the photosensitive material. The at least one heated roll is typically maintained at a temperature that is between the melt temperature of the uncured photopolymer on the low end and the melt temperature of the cured photopolymer on the upper end. This will allow selective removal of the photopolymer thereby creating the relief image.

Each of the plurality of consecutively arranged blotting stations 14, 16, 18, and 20 is preferably provided with variable controls for at least temperature and nip gap width and arranged in a controller 60. Suitable controllers include, but are not limited to, microprocessors and are generally well known in the art. One suitable controller is described in U.S. Pat. No. 5,279,697 to Peterson et al., the subject matter of which is herein incorporated by reference in its entirety.

The temperature to which at least the first roll of each of the plurality of consecutively arranged blotting stations 14, 16, 18, and 20 is heated may be separately controlled. The nip gap 25 between the first roll 22 and the second roll 24 may also be variably controlled to allow photosensitive printing elements of various thicknesses to pass through the plurality of consecutively arranged blotting stations 14, 16, 18, and 20 and to remove additional plate relief as the photosensitive printing element 15 passes through each of the plurality of consecutively arranged blotting stations 14, 16, 18, and 20. The gap 25 between the two heated rolls is generally set to be narrow enough to facilitate transfer of resin from the plate to the absorbent blotting material 33, but not so narrow as to crush the cured portions of the plate and damage the image. The nip gap 25 of each of the plurality of consecutively arranged blotting stations 14, 16, 18, and 20 may be adjusted to handle plates having a thickness between about 10 mils and about 100 mils. Pneumatic cylinder(s) (not shown) may be used to provide the appropriate nip gap 25 through which the photosensitive printing element 15 passes as it travels through the plurality of consecutively arranged blotting stations 14, 16, 18, and 20. The throughput speed of the photosensitive printing element 15 through the plurality of consecutively arranged blotting stations 14, 16, 18, and 20 may also be variably controlled.

The means for transporting the photosensitive printing element 15 through the plurality of consecutively arranged blotting stations 14, 16, 18, and 20 typically comprises one or more conveyors 30 and 40 attached,to drive motors (not shown). One conveyor 30 is positioned prior to the plurality of consecutively arranged blotting stations 14, 16, 18, and 20 to convey the photosensitive printing element 15 into the plurality of consecutively arranged blotting stations 14, 16, 18, and 20, while another conveyor 40 is positioned after the plurality of consecutively arranged blotting stations 14, 16, 18, and 20 to convey the photosensitive printing element 15 out of the plurality of consecutively arranged blotting stations 14, 16, 18, and 20 and through the post exposure/detack device 29. Movement of the photosensitive printing element 15 through the plurality of consecutively arranged blotting stations 14, 16, 18, and 20 is accomplished by the rotation of the first roll 22 and the second roll 24 to advance the photosensitive printing element 15 through the system. Optionally, another conveyor (not shown) may be used to move the photosensitive printing element 15 through the plurality of consecutively arranged blotting stations 14, 16, 18, and 20. The first roll 22 and the second roll 24 of each of the plurality of consecutively arranged blotting stations 14, 16, 18, and 20 are controlled to have the same rotational speed.

Each of the one or more conveyors 30 and 40 comprises a continuous loop 42 arranged around a plurality of rolls 46 and 48. Optionally, one or more additional rollers (not shown) may be used to provide additional support to the one or more conveyors 30 and 40 to prevent the continuous loop 42 from sagging from the weight of the photosensitive printing element 15. In a preferred embodiment, the continuous loop 42 comprises wire mesh. The photosensitive printing element 15 may be held on the one or more conveyors 30 and 40 by various means, including a vacuum or friction. In one embodiment, the photosensitive printing element 15 is transported through the plate feed section of the system by a sloping steel tray and gravity. In another variation, the photosensitive printing element 15 is transported through the post-cure section using friction and a rubberized belt.

The system of the invention may further comprise one or more supplemental heaters 37 arranged in a preheating zone 36 prior to the plurality of consecutively arranged blotting stations 14, 16, 18, and 20 to improve the efficiency of the softening/melting of the non-crosslinked photopolymer and to further soften and liquefy portions of the at least one layer of photosensitive material 15. In another embodiment of the invention, one or more supplemental heaters 45 are arranged between one or more of the plurality of blotting stations 14, 16, 18, and 20. Although various types of heaters may be used, preferably the supplemental heater is an infrared heater.

The means for providing blotting material to the first roll of each of the plurality of consecutively arranged blotting stations 14, 16, 18, and 20 typically comprises a supply roll 32 of blotting material 33 that is continuously supplied to the first roll 22 of each of the plurality of blotting stations 14, 16, 18, and 20, wherein the blotting material 33 is looped under and around at least the portion of the first roll 22 that contacts the imaged surface of the photosensitive printing element 15. Fresh blotting material 33 is generally continuously supplied to the first roll 22 of each of the plurality of consecutively arranged blotting stations 14, 16, 18, and 20 from a supply roll 32 of the web of absorbent blotting material 33.

A rewind device, which is preferably a take-up roller 34, may be used to rewind the blotting material 33 that contains the removed non-crosslinked polymer. Preferably, the take-up roller 34 is independently belt driven by a motor (not shown), which is preferably a variable speed motor. The take-up roller 34 collects the web of blotting material 33 after it has contacted the photosensitive printing element 15 and removed portions of the photosensitive material that were liquefied or softened. An auto-slicing device (not shown), may also be used to change over the supply roll 32 of blotting material 33 to a fresh roll of blotting material.

The blotting material is typically selected from the group consisting of screen mesh, absorbent fabrics, and paper. Either woven or non-woven fabric is used and the fabric can be polymer based or paper, so long as the fabric can withstand the operating temperatures involved. The specific type of blotting material is not critical to the present invention. The selection of the blotting material 33 depends in part upon the thickness of the photosensitive printing element 15 to be processed, the melting temperature of the blotting material 33, and the heat transfer characteristics of both the photosensitive printing element 15 and the blotting material 33.

The system of the invention further comprises means 29 to post-expose and detack the photosensitive printing element 15 after the photosensitive printing element 15 has been conveyed through the plurality of consecutively arranged blotting stations 14, 16, 18, and 20.

The system of the invention may comprise an enclosure 11 for housing the plurality of consecutively arranged blotting stations 14, 16, 18, and 20. If used, the enclosure 11 also comprises a plurality of openings to allow at least the photosensitive printing element to enter and exit the system of the invention.

In one embodiment of the invention, the system 10 comprises ventilation means 50 operatively connected to the enclosure 11 for treating and recycling air containing volatile organic compounds in the enclosure, wherein the volatile organic compounds are released into the enclosure as the portion of the photosensitive material is heated and then liquefies or softens. The ventilation system 50 prevents the buildup of organic vapors and odors inside the thermal plate processor or inside the room in which the processor sits. Additionally the ventilation system 50 eliminates the need for external ventilation of the organic vapor laden processor offgas.

Various ventilation means may be used in the practice of the invention. One suitable ventilation means comprises means for exhausting a flow of air containing the volatile organic compounds and other contaminants from the enclosure, a particulate filter for removing particulates from the flow of air, means for absorbing volatile organic compounds from the flow of air to produce a purified stream of air, and means for recycling the purified flow of air back into the enclosure.

In this system, after the flow of air is exhausted from the enclosure 11 to the ventilation means 50, the air is directed to a filtering system. The filtering system generally contains a particulate filter 52 for removing any suspending particle or droplets and an absorbent bed of material 54 that removes organic vapors. The temperature of the flow of air containing the contaminants may also be controlled using suitable temperature control means 56 to precipitate contaminants, improve removal of contaminants by the filtering system, and limit the tendency for vapors to escape. The temperature control means 56 may comprise a heat exchanger or a heat pump, although other means would also be known to those skilled in the art. Purified air may be recycled back into the enclosure 11 using suitable means (i.e., a blower), or alternately, may be released to the environment.

What is claimed is:

1. A system for thermally developing a photosensitive printing element to remove non-crosslinked photopolymer from an imaged surface of the photosensitive printing element, wherein the non-crosslinked photopolymer on the imaged surface of the photosensitive printing element is capable of being partially softened upon exposure to heat, the system comprising:

a) a plurality of consecutively arranged blotting stations, each of said plurality of consecutively arranged blotting stations comprising a gap between which the photosensitive printing element is transported;

b) means for heating the photosensitive printing element as it passes through the consecutively arranged blotting stations;

c) means for passing the photosensitive printing element through the plurality of consecutively arranged blotting stations; and d) means for providing blotting material to each of the plurality of consecutively arranged blotting stations such that the blotting material is contactable with the photosensitive printing element;

wherein when the photosensitive printing element passes through the gap of each of the plurality of consecutively arranged blotting stations and contacts the blotting material, the non-crosslinked photopolymer on the imaged surface of the photosensitive printing element is softened and removed by the blotting material.

2. The system according to claim 1, wherein the plurality of consecutively arranged blotting stations comprise from 2 to 6 blotting stations.

3. The system according to claim 1, wherein the plurality of consecutively arranged blotting stations are arranged in a substantially straight path.

4. The system according to claim 1, wherein the means for passing the photosensitive printing element through each of the plurality of consecutively arranged blotting stations further comprises a compliant cover to improve resin cleanout.

5. The system according to claim 1, wherein each of the plurality of consecutively arranged blotting stations is provided with a variable temperature control to control the temperature of the photosensitive printing element.

6. The system according to claim 1, wherein each of the plurality of consecutively arranged blotting stations is provided with a variable control for adjusting the gap.

7. The system according to claim 6, wherein the gap of each of the plurality of consecutively arranged blotting stations is adjusted to handle plates having a thickness between about 10 mils and about 100 mils.

8. The system according to claim 1, wherein the means for passing the photosensitive printing element through the plurality of consecutively arranged blotting stations comprises one or more conveyors, and each of said one or more conveyors comprises a continuous loop arranged around a plurality of rolls to transport the printing plates through the plurality of consecutively arranged blotting stations.

9. The system according to claim 8, wherein the photosensitive printing element is held on the one or more conveyors by vacuum.

10. The system according to claim 8, wherein the throughput speed of the photosensitive printing element through the plurality of consecutively arranged blotting stations is variably controlled.

11. The system according to claim 1, further comprising one or more supplemental heaters arranged in a preheating zone prior to the plurality of consecutively arranged blotting stations.

12. The system according to claim 1, further comprising one or more supplemental heaters arranged between one or more of the plurality of blotting stations.

13. The system according to claim 11, wherein the supplemental heater is an infrared heater.

14. The system according to claim 12, wherein the supplemental heater is an infrared heater.

15. The system according to claim 1, wherein the means for providing blotting material to each of the plurality of consecutively arranged blotting stations comprises a supply roll of blotting material that is continuously supplied to a first roll of each of the plurality of blotting stations, wherein the blotting material is looped under and around at least the portion of the first roll that contacts the imaged surface of the photosensitive printing element.

16. The system according to claim 15, further comprising a rewind device for rewinding the blotting material that contains the removed non-crosslinked polymer.

17. The system according to claim 15, further comprising an auto-slicing device to change over the supply roll of blotting material to a fresh roll of blotting material.

18. The system according to claim 1, wherein the blotting material is selected from the group consisting of screen mesh, absorbent fabrics, and paper.

19. The system according to claim 1, further comprising means to post-expose and detack the photosensitive printing element after the photosensitive printing element has been conveyed through the plurality of consecutively arranged blotting stations.

20. The apparatus according to claim 1, wherein the photosensitive printing element comprises a heat-resistant substrate selected from the group consisting of steel, aluminum, and high temperature polymers.

21. The system according to claim 1, further comprising an enclosure for housing the plurality of consecutively arranged blotting stations.

22. The system according to claim 21, further comprising ventilation means operatively connected to the enclosure for treating and recycling air containing volatile organic compounds in the enclosure, wherein the volatile organic compounds are released into the enclosure as the portion of the photosensitive material is heated and then liquefies or softens.

23. The system according to claim 22, wherein the ventilation means comprises:

a) means for exhausting a flow of air containing the volatile organic compounds and other contaminants from the enclosure;

b) a particulate filter for removing particulates from the flow of air;

c) means for absorbing volatile organic compounds from the flow of air to produce a purified stream of air; and d) optionally, means for recycling the purified flow of air back into the enclosure.

* * * * *